United States Patent
Madan

(10) Patent No.: US 6,906,945 B2
(45) Date of Patent: Jun. 14, 2005

(54) BITLINE PRECHARGE TIMING SCHEME TO IMPROVE SIGNAL MARGIN

(75) Inventor: Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/717,146

(22) Filed: Nov. 18, 2003

(65) Prior Publication Data

US 2005/0105354 A1 May 19, 2005

(51) Int. Cl.[7] .............................................. G11C 11/22
(52) U.S. Cl. ........................ 365/145; 365/149; 365/203
(58) Field of Search ................................ 365/145, 149, 365/203

(56) References Cited

U.S. PATENT DOCUMENTS 5,467,302 A * 11/1995 Hirano et al. ............... 365/145
5,675,530 A * 10/1997 Hirano et al. ............... 365/145

OTHER PUBLICATIONS

Ali Sheikholeslami et al., *A Survey of Circuit Innovations in Ferroelectric Random–Access Memories*, Proc. of the IEEE, vol. 88, No. 5, 667 (May 2000).

Ali Sheikholeslami, *Ferroelectric Memory Design* (*FeRAM 101*), ISSCC 2002 Tutorial (Feb. 3, 2002).

* cited by examiner

*Primary Examiner*—Son Mai
(74) *Attorney, Agent, or Firm*—Frederick J. Telecky, Jr.; W. James Brady, III

(57) ABSTRACT

A memory circuit and method to improve signal margin is disclosed. The circuit includes a memory array arranged in rows 702, 704, 706 and columns 750, 752 of memory cells. Each row of memory cells is connected to a respective wordline. Each column of memory cells is connected to one of a bitline and a complementary bitline. An active wordline accesses a respective row of memory cells. The memory circuit includes a plurality of precharge circuits 724, 726, 728. Each precharge circuit is connected to a respective column of memory cells and coupled to receive a precharge signal PRE. An active precharge signal renders a respective precharge circuit conductive. A control and decode circuit 700 changes an inactive wordline signal to an active wordline signal while the precharge signal is active.

36 Claims, 4 Drawing Sheets

FIG. 1
(PRIOR ART)
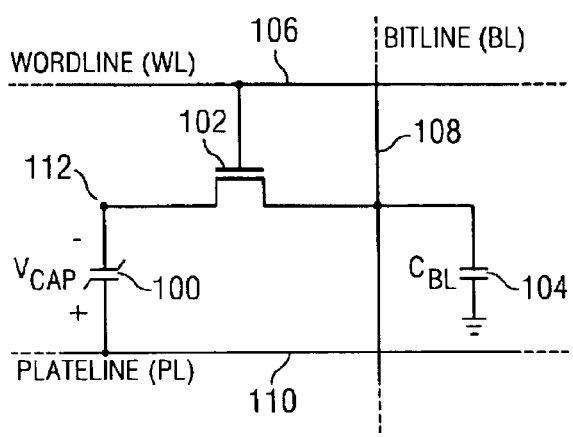
FIG. 2
(PRIOR ART)
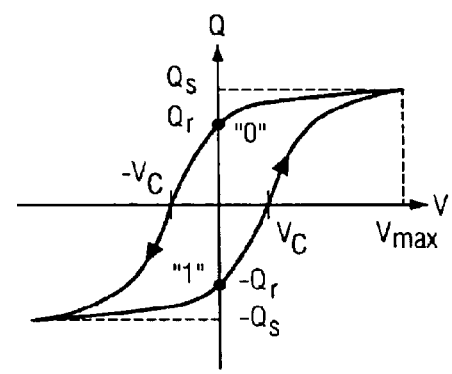
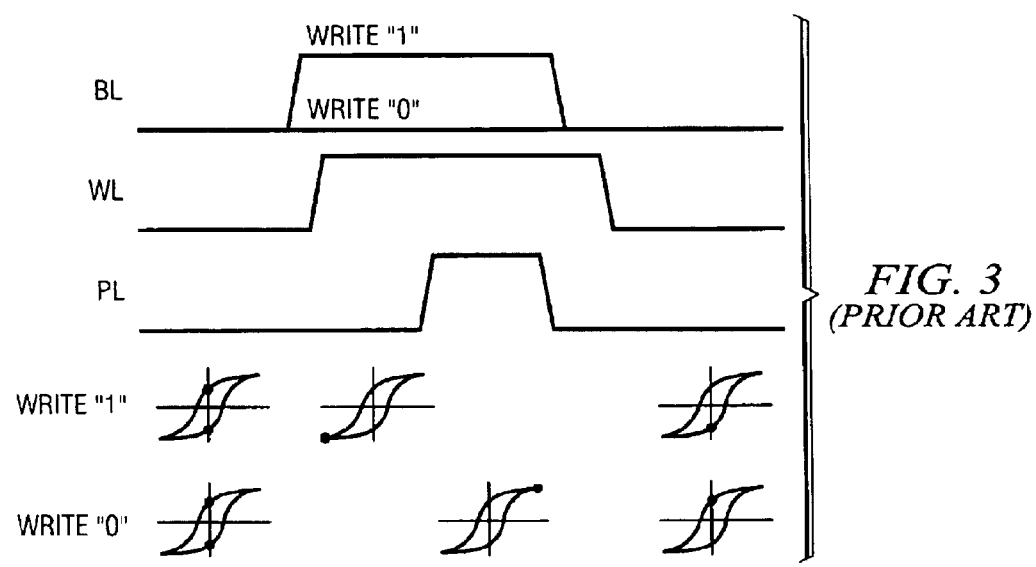
FIG. 3
(PRIOR ART)

BITLINE PRECHARGE TIMING SCHEME TO IMPROVE SIGNAL MARGIN

FIELD OF THE INVENTION

This invention generally relates to electronic circuits, and more specifically to nonvolatile semiconductor integrated circuits.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Many new applications, however, require the access time and packing density of previous generation nonvolatile memories in addition to low power consumption for battery powered circuits. One nonvolatile memory technology that is particularly attractive for these low power applications is the ferroelectric memory cell. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. However, both ferroelectric materials suffer from fatigue and imprint. Fatigue is characterized by a gradual decrease in net stored charge with repeated cycling of a ferroelectric capacitor. Imprint is a tendency to prefer one state over another if the ferroelectric capacitor remains in that state for a long time.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor (FeCAP) 100 is connected between plateline 110 and storage node 112. Access transistor 102 has a current path connected between bitline 108 and storage node 112. A control gate of access transistor 102 is connected to wordline 106 to control reading and writing of data to the ferroelectric memory cell. This data is stored as a polarized charge corresponding to cell voltage VcAp. Parasitic capacitance of bitline BL is represented by capacitor $C_{BL}$ 104.

Referring to FIG. 2, there is a hysteresis curve corresponding to the ferroelectric capacitor 100. The hysteresis curve includes net charge Q or polarization along the vertical axis and voltage along the horizontal axis. By convention, the polarity of cell voltage is defined as shown in FIG. 1. A stored "0", therefore, is characterized by a positive voltage at the plateline terminal with respect to the access transistor terminal. A stored "1" is characterized by a negative voltage at the plateline terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying –Vmax to the ferroelectric capacitor. This charges the linear and switching components of the ferroelectric capacitor to a saturation charge of –Qs. The stored charge reverts to –Qr when the electric field is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed.

Referring to FIG. 3, there is illustrated a typical write sequence for a ferroelectric memory cell as in FIG. 1. Initially, the bitline (BL), wordline (WL), and plateline (PL) are all low. The upper row of hysteresis curves illustrates a write "1" and the lower row represents a write "0". Either a "1" or "0" is initially stored in each exemplary memory cell. The write "1" is performed when the bitline BL and wordline WL are high and the plateline PL is low. This places a negative voltage across the ferroelectric capacitor and charges it to –Qs. When plateline PL goes high, the voltage across the ferroelectric capacitor is 0 V, and the stored charge reverts to –Qr. At the end of the write cycle, both bitline BL and plateline PL go low and stored charge –Qr remains on the ferroelectric capacitor. Alternatively, the write "0" occurs when bitline BL remains low and plateline PL goes high. This places a positive voltage across the ferroelectric capacitor and charges it to Qs representing a stored "1". When plateline PL goes low, the voltage across the ferroelectric capacitor is 0 V, and the stored charge reverts to Qr representing a stored "0".

A step sensing read operation is illustrated at FIG. 4 for the ferroelectric memory cell at FIG. 1. The upper row of hysteresis curves illustrates a read "0". The lower row of hysteresis curves illustrates a read "1". Wordline WL and plateline PL are initially low. Bitlines BL are precharged low. At time $t_0$ precharge signal PRE goes low, permitting the bitlines BL to float. At times $t_1$ and $t_2$ wordline WL and plateline PL go high, respectively, thereby permitting each memory cell connected to the active wordline WL and plateline PL to share charge with a respective bitline. A stored "1" will share more charge with parasitic bitline capacitance $C_{BL}$ and produce a greater bitline voltage than the stored "0" as shown between times $t_2$ and $t_3$. A reference voltage (not shown) is produced at each complementary bitline of an accessed bitline. This reference voltage is between the "1" and "0" voltages between times $t_2$ and $t_3$. A difference voltage between either a "1" or "0" voltage and a corresponding reference voltage is applied to each respective sense amplifier. The sense amplifiers are activated at time $t_3$ to amplify the difference voltage. When respective bitline voltages are fully amplified after time $t_3$, the read "0" curve cell charge has increased from Qr to Qs. By way of comparison, the read "1" data state has changed from a stored "1" to a stored "0". Thus, the read "0" operation is nondestructive, but the read "1" operation is destructive. At time $t_4$, plateline PL goes low and applies –Vmax to the read "1" cell, thereby storing –Qs. At the same time, zero voltage is applied to the read "0" cell and charge Qr is restored. At the end of the read cycle, signal PRE goes high and precharges both bitlines BL return to zero volts or ground. The wordline goes low, thereby isolating the ferroelectric capacitor from the bitline. Thus, zero volts is applied to the read "1" cell and –Qr is restored.

Referring now to FIG. 5, a pulse sensing read operation is illustrated for a ferroelectric memory circuit. The read operation begins at time to when precharge signal PRE goes low, permitting the bitlines BL to float. Wordline WL and plateline PL are initially low, and bitlines BL are precharged low. At time $t_1$, wordline WL goes high, thereby coupling a ferroelectric capacitor to a respective bitline. Then plateline PL goes high at time $t_2$, thereby permitting each memory cell to share charge with the respective bitline. The ferroelectric memory cells share charge with their respective bitlines BL and develop respective difference voltages. Here, $V_1$ represents a data "1" and $V_0$ represents a data "0". Plateline PL then goes low prior to time $t_3$, and the common mode difference voltage goes to near zero. The difference voltage available for sensing is the difference between one of $V_1$ and $V_0$ at time $t_3$ and a reference voltage (not shown) which lies approximately midway between voltages $V_1$ and $V_0$ at time $t_3$. The difference voltage is amplified at time $t_3$ by respective sense amplifiers and full bitline BL voltages are developed while the plateline PL is low. Thus, the data "1" cell is fully restored while plateline PL is low and the data "1" bitline BL is high. Subsequently, the plateline PL goes high while the data "0" bitline BL remains low. Thus, the data "0" cell is restored. The plateline PL goes low at time $t_4$, and precharge signal PRE goes high at time $t_5$. The high level of precharge signal PRE precharges the bitlines to ground or Vss. The wordline WL goes low at time $t_6$, thereby isolating the ferroelectric capacitor from the bitline and completing the pulse sensing cycle.

Turning now to FIG. 6, there is a simplified diagram of an unselected ferroelectric memory cell of the prior art illustrating a problem with both step and pulse sensing schemes. Here, the same reference numerals are used as in the memory cell of FIG. 1 to show comparable elements of the ferroelectric memory cell. Resistor $R_{GATE}$ 114 represents subthreshold leakage path of access transistor 102. Diode 116 is a parasitic junction diode between storage node 112 and the memory circuit substrate. The wordline terminal WL 106 is adjacent a selected wordline (not shown) during a read operation. Thus, wordline terminal 106 may develop 200 mV during a low-to-high transition of the adjacent active wordline, as will be explained in detail. Plateline 110 is common to cells on the selected wordline as well as the unselected cell. Ferroelectric capacitor 100 stores a respective data signal and preferably has zero volts until a coercive voltage is developed across the terminals as previously explained. For the following exemplary discussion, ferroelectric capacitor 100 has approximately 30 fF capacitance.

During a read or write operation a selected wordline adjacent wordline WL 106 is driven high to approximately 2.2 V. This capacitively couples 200 mV to wordline terminal 106 and greatly increases subthreshold conduction of access transistor 102. Bitline BL 108 is driven low, and plateline PL 110 is driven high to approximately 1.65 V. Due to charge sharing with diode 116 and gate-to-source capacitance of access transistor 102, the plateline PL transition couples 1.6 V to storage node 112. Thus, storage node 112 goes from 0 V to 1.6 V. Under these conditions at high temperature, subthreshold leakage current $I_{SUB}$ of access transistor 102 increases from less than 1 nA when there is no coupling to wordline 106 to approximately 100 nA, or about two orders of magnitude, when 200 mV is coupled to wordline 106. This level of subthreshold leakage current through resistor $R_{GATE}$ 114 lasts for approximately 4 ns until the wordline drive circuit can restore wordline WL 106 to 0 V. The subthreshold current $I_{SUB}$ of 100 nA for 4 ns, however, represents a 13 mV decrease in storage node voltage subject to the previously described conditions. Moreover, this charge loss is cumulative. Minimal current flows from bitline BL 108 through access transistor 102 when plateline PL 110 returns to 0 V due to the small drain-to-source voltage. Subsequent memory accesses to memory cells adjacent wordline WL 106 and resulting charge loss, however, may result in a negative voltage of as much as –200 mV at storage node 112. Such memory accesses would significantly degrade the data "1" level of the ferroelectric memory cell resulting in read errors. This degradation of the data "1" level introduces a bitline voltage imbalance and may even depolarize the ferroelectric capacitor.

SUMMARY OF THE INVENTION

In accordance with a preferred embodiment of the invention, a memory circuit and method to improve signal margin is disclosed. The circuit includes a memory array arranged in rows and columns of memory cells. Each row of memory cells is connected to a respective wordline. Each column of memory cells is connected to one of a bitline and a complementary bitline. An active wordline accesses a respective row of memory cells. The memory circuit includes a plurality of precharge circuits. Each precharge circuit is connected to a respective column of memory cells and coupled to receive a precharge signal. An active precharge signal renders a respective precharge circuit conductive. A control and decode circuit produces an active wordline signal while the precharge signal is active and before a plateline signal is activated. This active precharge signal eliminates accumulated charge at each memory cell storage node, thereby improving signal margin.

BRIEF DESCRIPTION OF THE DRAWINGS

The foregoing features of the present invention may be more fully understood from the following detailed description, read in conjunction with the accompanying drawings, wherein:

FIG. 1 is a circuit diagram of a ferroelectric memory cell of the prior art;

FIG. 2 is a hysteresis curve of the ferroelectric capacitor 100 of FIG. 1;

FIG. 3 is a timing diagram showing a write operation to the ferroelectric memory cell of FIG. 1;

DETAILED DESCRIPTION OF PREFERRED EMBODIMENTS

Figure 7:
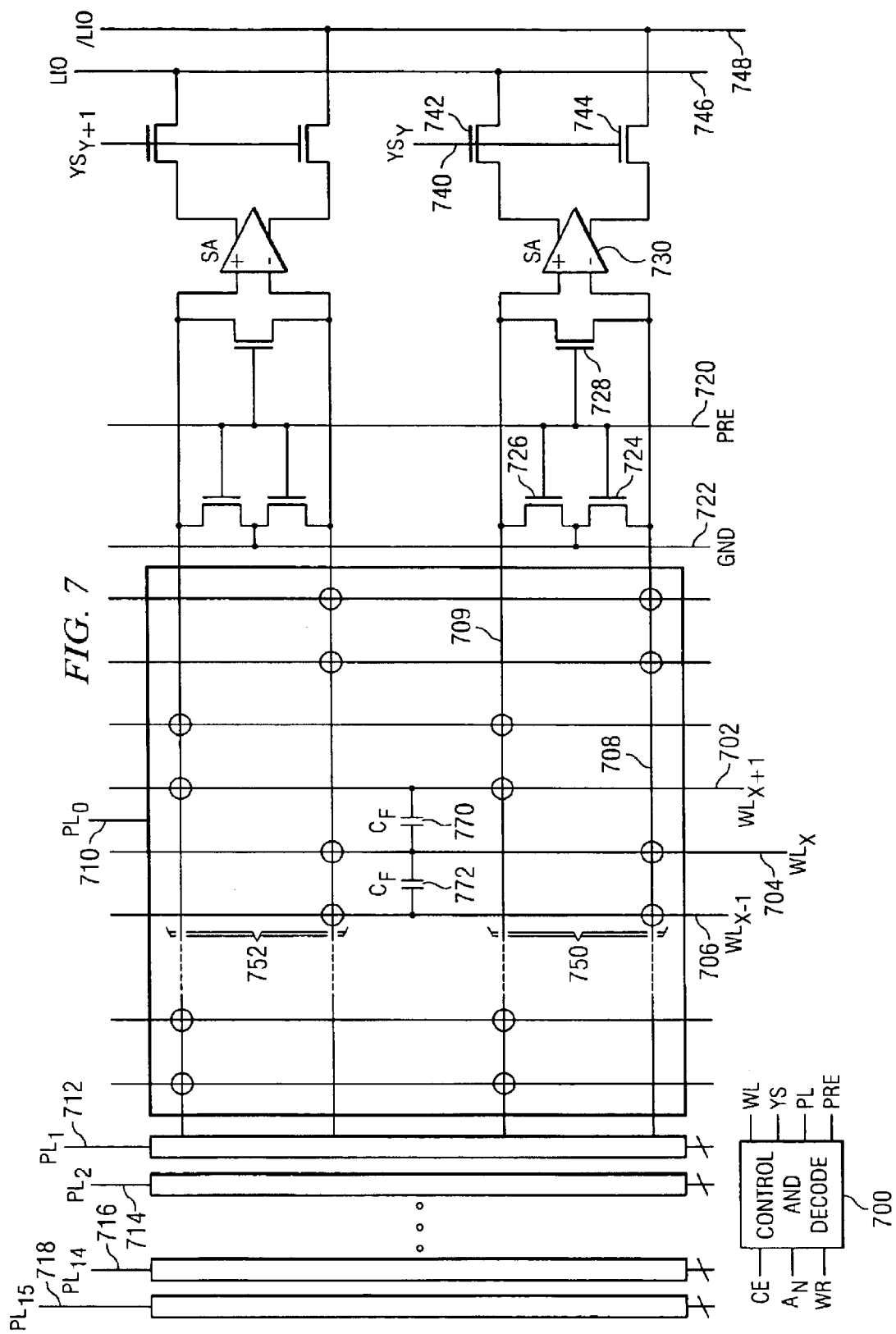
FIG. 7 is a schematic diagram of an embodiment of the memory circuit of the present invention.

Referring to FIG. 7, there is a memory circuit of the present invention. Although the memory circuit includes many similar memory arrays, only a portion of one array is shown for clarity. The memory array includes memory cells arranged in rows corresponding to wordlines 702, 704, 706 and columns 750, 752. Individual memory cells are indicated by circles at intersections of rows and columns. In an embodiment of the present invention there are preferably 512 rows and 64 columns in the memory array. The memory array also includes 16 platelines 710–718. Each plateline is coupled to receive a respective plateline signal $PL_0$–$PL_{15}$. Each plateline, for example plateline 710, is common to 32 rows of memory cells including rows common to wordlines 702–706. Each row of memory cells is selected by an active wordline signal. For example, row 704 is selected by active wordline signal $WL_X$ on wordline 704. Each column includes a bitline 708 and a complementary bitline 709 that form a bitline pair. Each bitline pair is coupled to a respective sense amplifier such as sense amplifier 730. Each sense amplifier has complementary output terminals coupled to local input/output lines LIO 746 and/LIO 748 by column select transistors 742 and 744, respectively. The column select transistors are selected by an active column select signal, for example, $YS_Y$ on lead 740. Each column has a respective precharge circuit including first 724, second 726, and third 728 precharge transistors. The first and second precharge transistors respectively couple the bitline 708 and complementary bitline 709 to voltage terminal GND via lead 722 in response to an active precharge signal PRE on lead 720. A third precharge transistor couples the bitline 708 and complementary bitline 709 to each other in response to the active precharge signal PRE on lead 720.

In operation, the control and decode circuit 700 receives a chip enable signal CE, an address signal $A_N$ including N address bits, and a read/write signal WR. The control and decode circuit produces an active wordline signal WL, an active column select signal YS, an active plateline signal PL, and a precharge signal PRE, where WL, YS, and PL represent a respective group of wordlines, column select lines, and platelines. A selected memory cell at the intersection of the addressed row and column receives or produces data on a respective bitline in response to a logical state of read/write signal WR. For example, when read signal WR is high, a write operation is performed. Alternatively, when read/write signal is low, a read operation is performed. For either a read or a write operation, when a wordline signal such as wordline signal WLx goes active high, a small voltage is coupled to adjacent wordlines $WL_{X+1}$ 702 and $WL_{X-1}$ 706 through fringe capacitors CF 770 and 772, respectively. This capacitive coupling increases the voltage on the adjacent wordlines $WL_{X+1}$ 702 and $WL_{X-1}$ 706 by as much as 200 mV and increases subthreshold leakage by approximately two orders of magnitude. Next, a low-to-high transition of plateline signal $PL_0$ 710 induces subthreshold current to flow from the storage node to the bitline. This charge loss couples as much as −13 mV to the storage node of each memory cell along adjacent wordlines 702 and 706 following a subsequent high-to-low transition of plateline signal $PL_0$ 710. Moreover, the subthreshold current from bitline to storage node of the memory cells on adjacent wordlines 702 and 706 when plateline signal $PL_0$ is low is much less than when high as previously explained. This is because the drain-to-source voltage of each access transistor is much less. Thus, repeated access to wordline $WL_X$ 704 results in accumulated negative voltage of as much as −200 mV at the storage node of each memory cell on adjacent wordlines 702 and 706.

Figure 6:
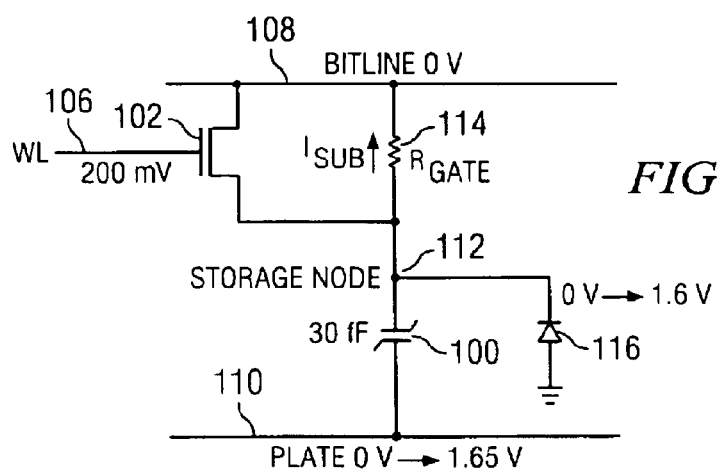
FIG. 6 is a simplified circuit diagram of the prior art showing charge accumulation at the ferroelectric memory cell storage node due to subthreshold leakage.
Figure 8A:
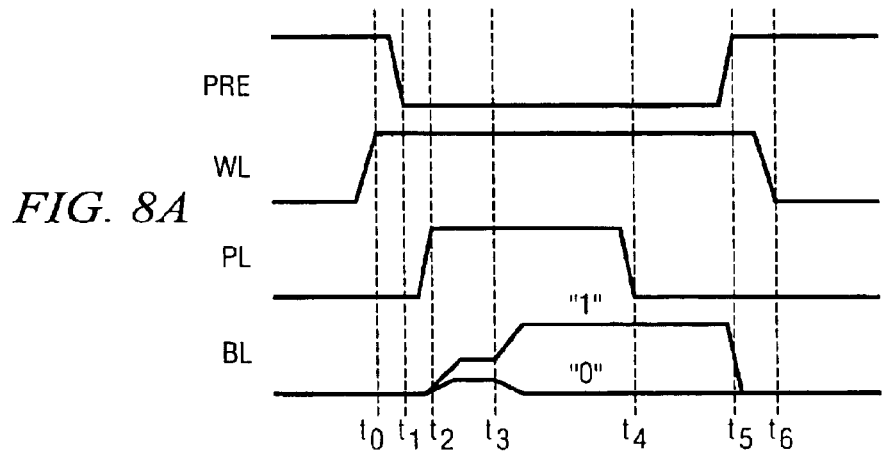
FIG. 8A is timing diagram of a first embodiment of the memory circuit of the present invention.

Referring to FIGS. 7 and 8A, a step sensing read or write memory cycle will be described in detail. In the following description, a memory cycle is from time $t_0$ through time $t_6$. The memory cycle on an adjacent wordline, for example wordline 702, is initiated when wordline signal $WL_{X-1}$) goes active high at time $t_0$. This turns on access transistor 102 (FIG. 6) while precharge signal PRE remains high and precharge transistors 724, 726, and 728 are still on. Due to the relatively small negative charge at storage node 112, a voltage of wordline signal $WL_{X+1}$ slightly greater than the threshold voltage of access transistor 102 is adequate. Likewise, a voltage of precharge signal PRE slightly greater than the threshold voltage of precharge transistors 724 and 726 is adequate. Storage node 112 is charged through access transistor 102 and complementary bitlines 708 and 709 are equalized through precharge transistor 728, thereby eliminating accumulated negative voltage. This elimination of accumulated negative voltage is highly advantageous. Complementary bitlines are fully equalized prior to sensing and signal margin is not degraded, therefore, by a bitline voltage imbalance.

Figure 4:
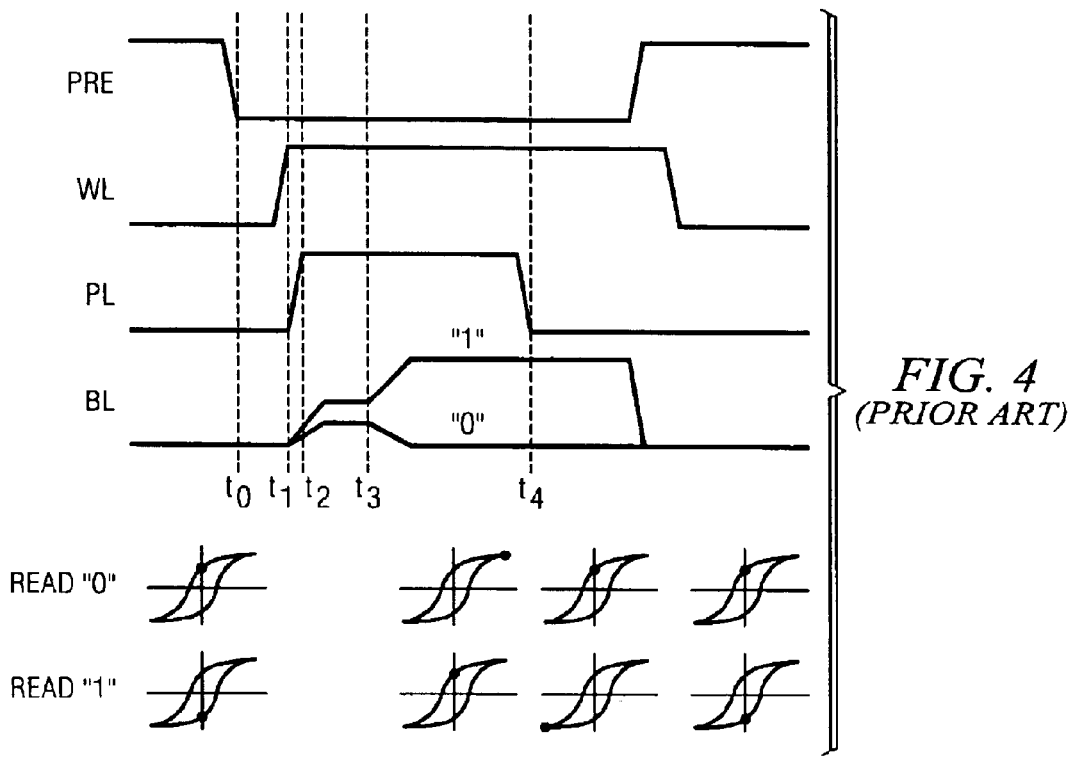
FIG. 4 is a timing diagram of a step sense read operation from the ferroelectric memory cell of FIG. 1.
Figure 5:
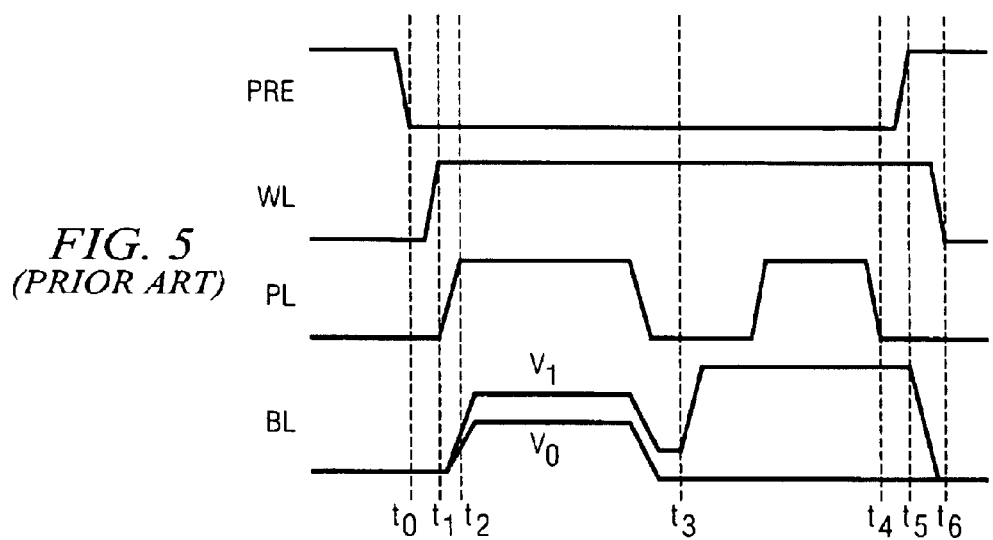
FIG. 5 is a timing diagram of a pulse sense read operation from the ferroelectric memory cell of FIG. 1.

Next, precharge signal PRE goes low at time $t_1$ and turns off precharge transistors 724, 726, and 728. Then plateline signal $PL_0$ goes active from an inactive state at time $t_2$. The high level of plateline signal $PL_0$ exceeds the coercive voltage $V_C$ (FIG. 2) of the ferroelectric capacitor and develops a voltage on bitline 709 representing one of a data "1" or a data "0". Bitline 708 receives a reference voltage intermediate the data "1" and data "0" levels, thereby producing a difference voltage at the input/output terminals of sense amplifier 730. At time $t_3$, sense amplifier 730 is activated to develop either a full data "1" or data "0" level on bitline 709. If a data "0" is developed on bitline 709, the memory cell ferroelectric capacitor is restored while the plateline signal $PL_0$ is high and bitline 709 is low. Alternatively, if a data "1" is developed on bitline 709, the memory cell ferroelectric capacitor data is destroyed as previously explained with respect to FIG. 4. At time $t_5$, plateline signal $PL_0$ goes low. This low level of plateline signal $PL_0$ and high level of a data "1" bitline 709 restores the memory cell ferroelectric capacitor data. Precharge signal PRE returns to a high level at time $t_4$, thereby turning on precharge transistors 724, 726, and 728 and precharging complementary bitlines 708 and 709 to ground GND through lead 722. The memory cycle is completed when wordline signal $WL_{X+1}$ goes low and turns off respective access transistors along wordline 702.

Figure 8B:
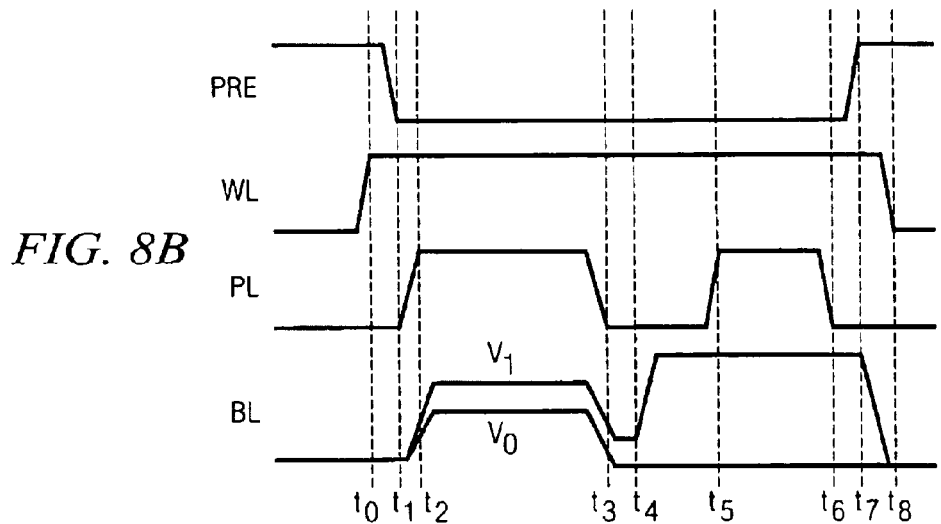
FIG. 8B is a timing diagram of a second embodiment of the memory circuit of the present invention.

Referring now to FIGS. 7 and 8B, a read or write memory cycle for a pulse sensing circuit will be described in detail. In the following description, a memory cycle is from time $t_0$ through time $t_8$. Adjacent wordline signal $WL_{X+1}$ 702, for example, goes active high at the beginning of a memory access cycle at time $t_0$. As in the previous discussion, access transistor 102 (FIG. 6) turns on while precharge signal PRE remains high and precharge transistors 724, 726, and 728 are still on. Due to the relatively small negative charge at storage node 112, a voltage of wordline signal $WL_{X+1}$ slightly greater than the threshold voltage of access transistor 102 is adequate. Likewise, a voltage of precharge signal PRE slightly greater than the threshold voltage of precharge transistors 724 and 726 is adequate. Storage node 112 (FIG. 6) is charged through access transistor 102 and complementary bitlines 708 and 709 are equalized through precharge transistor 728, thereby eliminating accumulated negative voltage. Thus, any accumulated negative voltage (or positive voltage for any reason not described above) at the sense node is eliminated and complementary bitlines are fully equalized prior to sensing. Signal margin, therefore, is not degraded due to bitline imbalance.

Next, precharge signal PRE goes low at time $t_1$ and turns off precharge transistors 724, 726, and 728. Then plateline signal $PL_0$ goes active from an inactive state at time $t_2$. The high level of plateline signal $PL_0$ exceeds the coercive voltage $V_c$ FIG. 2) of the ferroelectric capacitor and develops a voltage on bitline 709 representing either a data "1" or a data "0". Bitline 708 maintains a reference voltage intermediate the data "1" and data "0" levels, thereby producing a difference voltage at the input/output terminals of sense amplifier 730. At time $t_3$, plateline signal $PL_0$ goes low and returns the common mode bitline voltage to near zero. The difference voltage available for sensing is the difference between one of voltages $V_1$ and $V_0$ at time $t_3$ and a reference voltage (not shown) which is approximately midway between voltages $V_1$ and $V_0$ at time $t_3$. At time $t_4$, sense amplifier 730 is activated to develop either a full data "1" or data "0" level on bitline 709. If a data "1" is developed on bitline 709, the memory cell ferroelectric capacitor is restored while the plateline signal $PL_0$ is low and bitline 709 is high. Alternatively, if a data "0" is developed on bitline 709, the memory cell ferroelectric capacitor is restored at time $t_5$ after the plateline signal $PL_0$ goes high and while bitline 709 is low. At time $t_6$, plateline signal $PL_0$ goes low again. This low level of plateline signal $PL_0$ and high level of bitline 709 provides additional time to restore a data "1" memory cell ferroelectric capacitor between times $t_6$ and $t_7$. Precharge signal PRE returns to a high level at time $t_7$, thereby turning on precharge transistors 724, 726, and 728 and precharging complementary bitlines 708 and 709 to ground GND or Vss through lead 722. The memory cycle is completed when wordline signal $WL_{X+1}$ goes low and turns off respective access transistors along wordline 702.

The present invention advantageously eliminates accumulated negative or positive voltage at the storage node of ferroelectric memory cells prior to either step sensing or pulse sensing. Bitlines and complementary bitlines are precharged to a predetermined voltage until immediately before sensing. Other forms of array noise, therefore, are reduced. Any accumulated negative or positive voltage at the storage node is not imparted to the bitline difference voltage. Thus, signal margin is improved prior to sensing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, referring back to FIGS. 7, 8A, and 8B, column select signal $YS_y$ on lead 740 may be activated any time between times $t_2$ and 14 during a write operation. Such timing variations depend on sense amplifier design and individual design preference. Furthermore, a preferred embodiment of the present invention has been described with respect to a one-transistor/one-capacitor (1T/1C) storage cell. The present invention, however, is equally applicable to two-transistor/two-capacitor (2T/2C) memory cells. These 2T/2C cells are complementary 1T/1C memory cells. A wordline (or wordlines) activates the 2T/2C memory cell, thereby coupling the complementary 1T/1C memory cells to their respective complementary bitlines. If the 2T/2C memory cell stores a data "1", for example, the true and complementary bitline voltages change to produce a total difference voltage. The present invention with the previously described timing of FIGS. 8A and 8B would advantageously eliminate bitline imbalance due to storage node voltage accumulation as with the previously described embodiments. It is therefore intended that the appended claims encompass any such modifications or embodiments.

What is claimed is:

1. A method of reducing noise voltage in a memory circuit, comprising the steps of:

activating a first signal line adjacent a control terminal of a memory cell;

coupling a voltage from the signal line to the control terminal of the memory cell;

applying a second control signal to the memory cell;

coupling the noise voltage to the memory cell in response to the step of applying the second control signal;

activating a precharge signal applied to a precharge circuit precharge a bitline connected to the memory cell to a predetermined voltage;

activating a first control signal from an inactive state after the step of coupling while the precharge signal is active, the first control signal applied to the control terminal of the memory cell, the memory cell having a current path connected to the bitline, wherein the noise voltage is conducted to the bitline through the current path; and inactivating the precharge signal while the first control signal is active.

2. A method as in claim 1, wherein the memory cell comprises Lead Zirconate Titanate (PZT).

3. A method as in claim 1, wherein the memory cell comprises Strontium Bismuth Titanate (SBT).

4. A method as in claim 1, comprising the step of inactivating the first control signal while the precharge signal is active.

5. A method as in claim 1, comprising the step of activating from an inactive state second the control signal applied to the memory cell after the step of inactivating the precharge signal.

6. A method as in claim 5, comprising the steps of:

inactivating the second control signal while the first control signal is active; and activating the precharge signal while the first control signal is active and the second control signal is inactive.

7. A method as in claim 6, wherein the first control signal is a wordline signal, and wherein the second control signal is a plateline signal.

8. A method as in claim 7, wherein the wordline signal is applied to a first wordline and not applied to a second wordline, and wherein the plateline signal is applied to memory cells connected to the first and the second wordline.

9. A method as in claim 1, wherein the step of activating a precharge signal precharges the bitline and a complementary bitline to the predetermined voltage.

10. A method as in claim 9, wherein the predetermined voltage is Vss.

11. A memory circuit, comprising:

a memory array arranged in rows and columns of memory cells, each row of memory cells connected to a respective wordline, each column of memory cells connected to one of a bitline and a complementary bitline; wherein an active wordline accesses a respective row of memory cells;

a plurality of precharge circuits, each precharge circuit connected to a respective column of memory cells and coupled to receive a precharge signal, wherein an active precharge signal renders a respective precharge circuit conductive;

a control circuit arranged to produce an active wordline signal from an inactive wordline signal while the precharge signal is active;

a plateline circuit arranged to apply a first plateline signal pulse to the respective row of memory cells to produce a difference voltage between the bitline and the complementary bitline and to apply a second plateline signal pulse to restore data to the respective row of memory cells; and a sense amplifier circuit arranged to amplify the difference voltage.

12. A memory circuit as in claim 11, wherein the memory cells are ferroelectric memory cells.

13. A memory circuit as in claim 11, wherein each precharge circuit comprises:

a first transistor connected between a respective bitline and a voltage terminal;

a second transistor connected between a respective complementary bitline and the voltage terminal.

14. A memory circuit as in claim 13, wherein each precharge circuit comprises a third transistor connected between the respective bitline and the respective complementary bitline.

15. A memory circuit as in claim 13, wherein each column of memory cells is coupled to a respective sense amplifier, each sense amplifier arranged to amplify a difference voltage between one of a bitline or complementary bitline voltage and a reference voltage.

16. A memory circuit as in claim 15, wherein the reference voltage is applied to the other of the bitline or complementary bitline.

17. A memory circuit, comprising:

a bitline;

a complementary bitline;

a voltage terminal;

a first access transistor connected to the bitline, the first access transistor having a first control terminal coupled to receive a first control signal arranged to turn the access transistor on;

a second access transistor connected to the complementary bitline, the second access transistor having a second control terminal coupled to receive the first control signal arranged to turn the second access transistor on;

a first precharge transistor having a current path coupled between the bitline and the voltage terminal, the first precharge transistor having a gate coupled to receive a precharge signal, wherein the precharge signal turns the first precharge transistor off and on while the first access transistor is on;

a second precharge transistor having a current path coupled between the complementary bitline and the voltage terminal, the second precharge transistor having a gate coupled to receive the precharge signal;

a plateline circuit arranged to apply a first plateline signal pulse to a memory cell including the first and second access transistors to produce a difference voltage between the bitline and the complementary bitline and to apply a second plateline signal pulse to restore data to the memory cell; and a sense amplifier circuit arranged to amplify the difference voltage.

18. A memory circuit as in claim 17, wherein the memory circuit is a ferroelectric memory circuit.

19. A memory circuit as in claim 17, wherein each of the first and second control terminals is a wordline terminal.

20. A memory circuit as in claim 17, comprising:

a third control terminals coupled to receive the first and second plateline signal pulses; and a first ferroelectric capacitor coupled between the first access transistor and the third control terminal; and a second ferroelectric capacitor coupled between the first second access transistor and the third control terminal.

21. A memory circuit as in claim 20, wherein the first plateline signal pulse produces a voltage on the bitline and the complementary bitline after the precharge signal turns off the first and second precharge transistors.

22. A memory circuit as in claim 17, comprising a third precharge transistor having a current path coupled between the bitline and the complementary bitline, the third precharge transistor having a gate coupled to receive the precharge signal.

23. A memory circuit, comprising:

a bitline;

a complementary bitline:

a voltage terminal;

an access transistor connected to the bitline, the transistor having a first control terminal coupled to receive a first control signal arranged to turn the access transistor on;

a first precharge transistor having a current path coupled between the bitline and the voltage terminal, the first precharge transistor having a gate coupled to receive a precharge signal, wherein the precharge signal turns the first precharge transistor off from an on state while the access transistor is on;

a plateline circuit arranged to apply a first plateline signal pulse to a memory cell including the access transistor to produce a difference voltage between the bitline and the complementary bitline and to apply a second plateline signal pulse to restore data to the memory cell; and a sense amplifier circuit arranged to amplify the difference voltage.

24. A memory circuit as in claim 23, wherein the memory circuit is a ferroelectric memory circuit.

25. A memory circuit as in claim 23, wherein the first control terminal is a wordline terminal.

26. A memory circuit as in claim 23, comprising:

a second control terminal coupled to receive the first and second plateline signal pulses; and a ferroelectric capacitor coupled between the access transistor and the second control terminal.

27. A memory circuit as in claim 26, wherein the second control signal produces a voltage on the bitline after the precharge signal turns off the first precharge transistor.

28. A memory circuit as in claim 26, comprising:

a second precharge transistor having a current path coupled between the complementary bitline and the voltage terminal, the second precharge transistor having a gate coupled to receive the precharge signal.

29. A memory circuit as in claim 28, comprising a third precharge transistor having a current path coupled between the bitline and the complementary bitline, the third precharge transistor having a gate coupled to receive the precharge signal.

30. A method of operating a memory circuit to reduce a charge coupled to a memory cell, comprising the steps of:

coupling the charge to the memory cell while a first control signal applied to a control terminal of the memory signal is inactive;

activating a precharge signal applied to a precharge circuit to precharge a bitline to a predetermined voltage;

activating the first control signal while the precharge signal is active, the first control signal applied to the control terminal of the memory cell, the memory cell having a current path connected to the bitline;

conducting at least a part of the charge to the predetermined voltage;

applying an inactive second control signal to the memory cell;

then inactivating the precharge signal; and then activating the second control signal.

31. A method as in claim 30, comprising the step of inactivating the first control signal while the precharge signal is active.

32. A method as in claim 30, comprising the steps of:

inactivating the second control signal while the first control signal is active; and activating the precharge signal while the first control signal is active and the second control signal inactive.

33. A method as in claim 32, wherein the first control signal is a wordline signal, and wherein the second control signal is a plateline signal.

34. A method as in claim 33, wherein the wordline signal is applied to a first wordline and not applied to a second wordline, and wherein the plateline signal is applied to memory cells connected to the first and the second wordline.

35. A method as in claim 30, wherein the step of activating a precharge signal precharge the bitline and a complementary bitline to the predetermined voltage.

36. A method as in claim 35, wherein the predetermined voltage is Vss.

* * * * *